United States Patent [19]
Arakawa

[11] Patent Number: 4,636,658
[45] Date of Patent: Jan. 13, 1987

[54] VOLTAGE DETECTING DEVICE
[75] Inventor: Hideki Arakawa, Yokohama, Japan
[73] Assignee: Fujitsu Limited, Kawasaki, Japan
[21] Appl. No.: 704,995
[22] Filed: Feb. 25, 1985
[30] Foreign Application Priority Data
Feb. 28, 1984 [JP] Japan .................. 59-035115
[51] Int. Cl.$^4$ ........................... H03K 5/153
[52] U.S. Cl. ................ 307/350; 307/296 A; 307/363; 357/23.6; 357/41; 357/59
[58] Field of Search ............ 307/296 A, 350, 363, 307/354; 365/104, 185, 230, 189; 357/59, 23.6, 41

[56] References Cited
U.S. PATENT DOCUMENTS
4,451,748  5/1984  Amrany .................. 307/578
4,521,696  6/1985  Raghunathan ............ 307/350
4,527,180  7/1985  Oio ....................... 357/23.6
4,543,594  9/1985  Mohsen et al. .......... 357/23.6

Primary Examiner—John Zazworsky
Attorney, Agent, or Firm—Armstrong, Nikaido, Marmelstein & Kubovcik

[57] ABSTRACT

A voltage detecting device including a voltage dividing circuit (VD) formed by two capacitors ($C_1'$, $C_2$) connected in series, an inverter circuit (INV) for detecting whether the potential at the common node ($N_1$) of the capacitors ($C_1'$, $C_2$) reaches a predetermined value, and a switching transistor ($Q_3$) linked between the common node ($N_1$) and a power supply terminal (GND). When a voltage ($INP_0$) is not applied to the voltage dividing circuit (VD), the switching transistor ($Q_3$) is turned on so as to expel the charges at the common node ($N_1$).

7 Claims, 6 Drawing Figures

VOLTAGE DETECTING DEVICE

BACKGROUND OF THE INVENTION (1) Field of the Invention

The present invention relates to a voltage detecting device made by capacitors connected in series. This voltage detecting device is used, for example, in an electrically erasable and programmable read-only memory ($E^2PROM$), a nonvolatile random access memory (NOVRAM), and the like.

(2) Description of the Related Art

In an $E^2PROM$, NOVRAM, and the like, the write/erase voltage $V_{PP}$ is remarkably higher than the normal power supply voltage $V_{CC}$ (for example, 5 V). Such a write/erase voltage $V_{PP}$ is 20 V to 25 V. In the prior art, this write/erase voltage $V_{PP}$ is supplied from the exterior. However, in recent years, a step-up circuit has been provided in each chip to generate an internal write/erase voltage (IVP). According to this, the external power supplies and external terminals (pads) of the chips can be reduced.

During a write/erase mode, a clock signal is supplied to the step-up circuit, thereby increasing the write/erase voltage IVP. As a result, this high voltage IVP is applied to a memory cell so as to perform a write/erase operation thereupon due to the tunneling effect. In this case, however, a write/erase voltage detecting device is required for detecting the write/erase voltage IVP so as to prevent the voltage from being higher than a predetermined value.

Note that, if the write/erase voltage IVP is higher than the predetermined value, the cell to which the write/erase voltage is applied may be destroyed or the life-time thereof reduced.

A prior art voltage detecting device includes a voltage dividing circuit formed by two capacitors connected in series and an inverter circuit for detecting whether the potential at the common node of the capacitors reaches a predetermined value. Note that such an inverter circuit is suitable for detecting a relatively low voltage. Therefore, since a relatively high voltage is reduced to a relatively low voltage by the voltage dividing circuit, such a relatively high voltage can be detected indirectly by the inverter circuit.

In the above-mentioned prior art voltage detecting device, the upper side capacitor is conventionally formed by two polycrystalline silicon layers having a silicon dioxide layer therebetween. In this case, the silicon dioxide layer is obtained by oxidizing one of the polycrystalline silicon layers. However, such a silicon dioxide layer has a low tunneling emission start electric field strength, such as 1 to 3 MV/cm, so the silicon dioxide layer has to be thick so as to avoid tunneling emission, increasing the occupied area thereof. In addition, charges at the node of the capacitors leak due to the tunneling effect, so that the potential at the node is shifted. Further, traps are formed in the silicon dioxide layer obtained by oxidizing polycrystalline silicon. Therefore, charges are trapped at the traps, affecting the potential at the above-mentioned node. Thus, the dividing ratio of voltage by the voltage dividing circuit is not accurate. Accordingly, the above-mentioned voltage detecting device cannot accurately detect whether a high voltage reaches the predetermined value.

SUMMARY OF THE INVENTION

It is an object of the present invention to provide a voltage detecting device which can accurately detect whether a high voltage reaches the predetermined value.

According to the present invention, a switching transistor is linked between the node of the capacitors and a power supply terminal such as the ground. When a voltage to be detected is not applied to the voltage detecting device, the switching transistor is turned on, so that the potential at the node remains at the ground potential. That is, even when charges are injected to the node due to the tunneling effect, such charges are expelled therefrom. Only when a voltage to be detected is applied to the voltage detecting device, the switching transistor is turned off, and the potential at the node is detected by the inverter circuit.

Thus, the potential at the node of the capacitors is not shifted by the tunneling effect, so it is possible to detect whether a high voltage reaches the predetermined value.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENT

Figure 1:
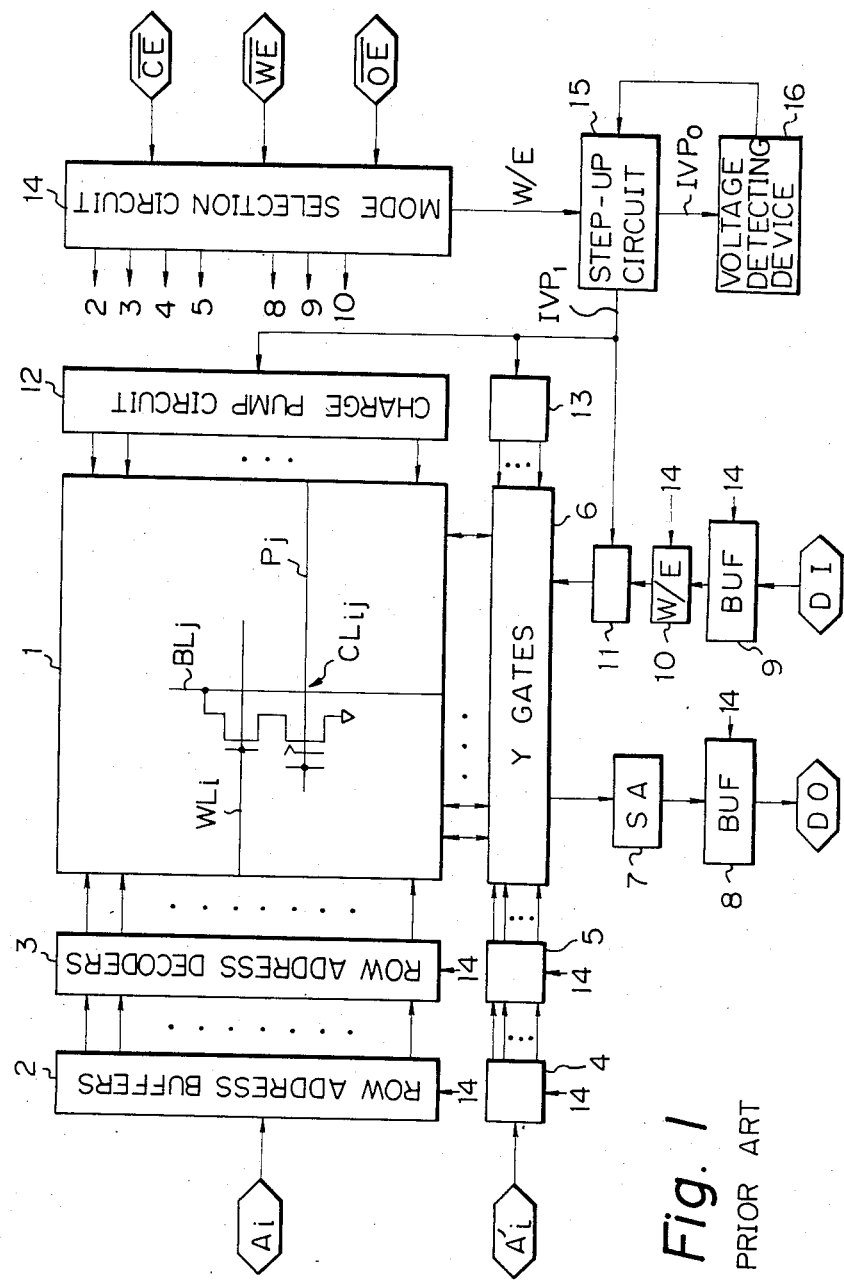
FIG. 1 is a block circuit diagram schematically illustrating all of an $E^2PROM$ to which the present invention applies.

First, an example of an $E^2PROM$ will be explained with reference to FIG. 1. In FIG. 1, reference numeral 1 designates a memory cell array including memory cells. For example, a memory cell $CL_{ij}$ is provided at an intersection between a word line $W_i$ and a bit line $BL_j$. $P_j$ designates a program line. Reference numeral 2 designates row address buffers each receiving an X-address signal $A_i$(i=0 to n); 3 row address decoders; 4 column address buffers each for receiving a Y-address signal $A_i'$(i=0 to n); 5 column address decoders; and 6 Y-gates. Output data is transmitted from the Y-gates 6 via a sense amplifier 7 and an output data buffer 8 to an output terminal DO, while input data is supplied from an input terminal DI via an input data buffer/latch circuit 9, a write/erase control circuit 10, and a charge pump circuit 11 to the Y-gates 6.

Reference numeral 14 designates a mode selection circuit for receiving a chip-enable signal $\overline{CE}$, a write-enable signal $\overline{WE}$, an output-enable signal $\overline{OE}$, and the like, so as to select an operation mode. That is, the mode selection circuit 14 controls the elements 2, 3, 4, 5, 8, 9, and 10, in accordance with the signal $\overline{CE}$, $\overline{WE}$, $\overline{OE}$, and the like.

Reference numeral 15 designates a step-up circuit for generating a write/erase voltage $IVP_1$ during a write/erase mode (W/E="1"), and 16 designates a voltage detecting device. The voltage detecting device 16 detects whether an output voltage $IVP_0$ of the step-up circuit 15 reaches a predetermined value, thereby preventing the write/erase voltage $IVP_1$ from being higher than a predetermined value. Note that, in this case, the voltage $IVP_0$ is about the same as the voltage $IVP_1$.

The write/erase voltage $IVP_1$ is applied to the charge pump circuits 11, 12, and 13.

A writing operation for the memory cell $CL_{ij}$ is carried out by applying a high voltage (20 V to 25 V) to the word line $WL_i$ and to the bit line $BL_j$. An erasing operation for the memory cell $CL_{ij}$ is carried out by applying a high voltage (20 V to 25 V) to the word line $WL_i$ and to the program line $P_j$. Generally, in an $E^2PROM$, note that a "writing operation" is to write data "1" into a cell, and an "erasing operation" is to write data "0" into a cell. The read operation for the memory cell $C_{ij}$ is carried out by applying a power supply voltage $V_{CC}$ (=5 V) to the word line $WL_i$ and applying a predetermined bias voltage (about 2 V) to the program line $P_j$.

Figure 2:
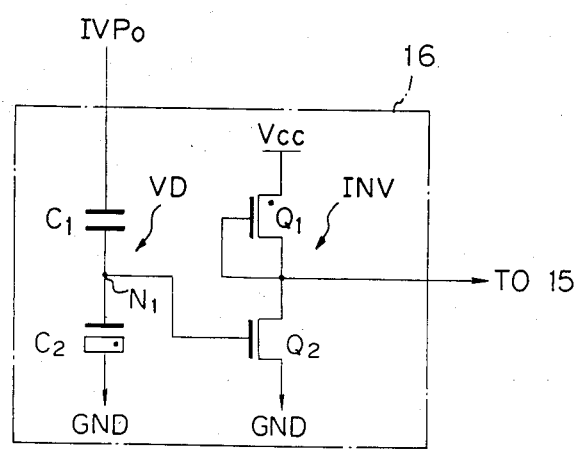
FIG. 2 is a circuit diagram of a prior art voltage detecting device.

In FIG. 2, which illustrates the voltage detecting device 16 of FIG. 1, the voltage detecting device includes a voltage dividing circuit VD formed by the series connection of capacitors $C_1$ and $C_2$ and an inverter circuit INV formed by a depletion-type transistor $Q_1$ and an enhancement-type transistor $Q_2$.

Note that $V_{CC}$ designates a power supply voltage such as 5 V, and GND designates the ground potential such as 0 V.

In this case, the potential $V_{N1}$ at node $N_1$ is $$V_{N1} = \frac{C_1}{C_1 + C_2} IVP_0$$

Figure 3:
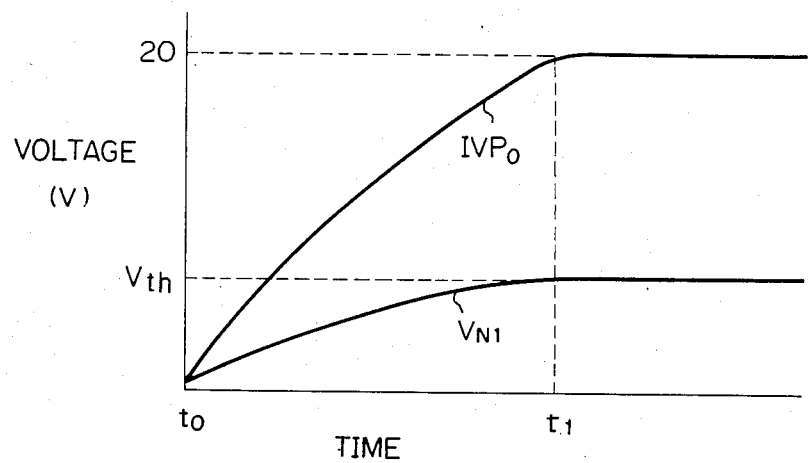
FIG. 3 is a timing diagram of the write/erase voltage and the potential at the node of FIG. 2.

Therefore, when the write/erase voltage $IVP_0$ rises as illustrated in FIG. 3, the potential $V_{N1}$ also rises in proportion thereto. As a result, at time $t_1$, the potential $V_{N1}$ reaches the threshold voltage $V_{th}$ of the inverter INV, which is the same as the threshold voltage of the transistor $Q_2$, thereby changing the output potential of the inverter INV from a high level to a low level.

The above-mentioned low output signal of the voltage detecting device, i.e., the low level output potential of the inverter circuit INV, is supplied to the step-up circuit 15 of FIG. 1. As a result, in the interior of the step-up circuit 15, the input of the write/erase signal W/E from the mode selection circuit 14 is inhibited, thereby stopping the increase of the potential of the write/erase voltage $IVP_1$. Thus, the write/erase voltage $IVP_1$ never becomes higher than the predetermined value, such as 20 V.

Note that it is impossible to detect the write/erase voltage $IVP_0$ by the inverter circuit INV, since the threshold voltage $V_{th}$ of the inverter circuit INV cannot be large and is at most 3 V to 4 V in the case where $V_{CC}=5$ V. In order to reduce the write/erase voltage $IVP_0$ for the threshold voltage $V_{th}$ of the inverter circuit INV, the above-mentioned voltage dividing circuit VD is provided. In addition, the voltage dividing circuit VD has an advantage that no direct current loss is generated, since the circuit VD is of a capacitive configuration.

Figure 4:
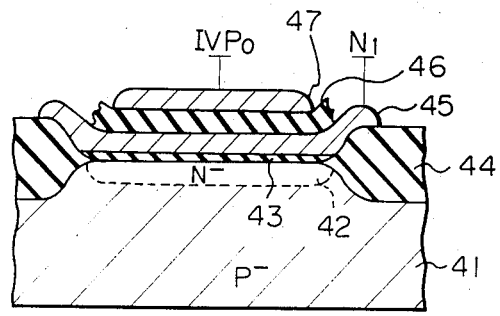
FIG. 4 is a cross-sectional view of the voltage dividing circuit of FIG. 2.

The configuration of the voltage dividing circuit VD of FIG. 2 will be explained with reference to FIG. 4. The voltage dividing circuit VD is manufactured by using so-called double-layer polycrystalline silicon technology. In FIG. 4, reference numeral 41 designates a $P^-$-type monocrystalline silicon substrate having an $N^-$-type impurity diffusion region 42 therein. A thin insulating layer ($SiO_2$) 43 and a thick insulating layer (field layer: $SiO_2$) 44 are both formed by oxidizing the monocrystalline silicon substrate 41. A first polycrystalline silicon layer 45, a relatively thick insulating layer ($SiO_2$) 46, and a second polycrystalline silicon layer 47 are formed in this order. In this case, the relatively thick insulating layer 46 is formed by oxidizing the first polycrystalline silicon layer 45. The capacitor $C_1$ is constructed by the first polycrystalline silicon layer 45, the second polycrystalline silicon layer 47, and the insulating layer 46 therebetween, while the capacitor $C_2$ is formed by the $N^-$-type diffusion layer 42, the first polycrystalline silicon layer 45, and the insulating layer 43 therebetween. In this case, most of the write/erase voltage $IVP_0$ is applied to the capacitor $C_1$ rather than the capacitor $C_2$, since the voltage division ratio of the voltage dividing circuit VD is, for example, 20 V/2 V (=10). Therefore, since the insulating layer 46 obtained by the oxidation of polycrystalline silicon has a lower tunneling emission start electric field strength such as 1 to 3 MV/cm as compared with a monocrystalline silicon oxidized layer (5 to 7 MV/cm), the thickness of this layer has to be large so as to avoid the tunneling emission, thereby increasing the occupied area thereof. In addition, charges are injected to node $N_1$ due to the tunneling effect, since a high voltage is applied mostly to the insulating layer 46. In this case, electrons are emitted from the first polycrystalline silicon layer 45 via the insulating layer 46 to the second polycrystalline silicon layer 47. Accordingly, holes remain semi-permanently at the first polycrystalline silicon layer 45, since the layer 45 is in a floating state. As a result, the potential at node $N_1$ increases, thereby substantially reducing the write/erase voltage $IVP_0$.

Further, more traps are present in the polycrystalline silicon oxidized layer than in the monocrystalline silicon oxidized layer. Charges trapped at such traps also may affect the potential at node $N_1$.

Figure 5:
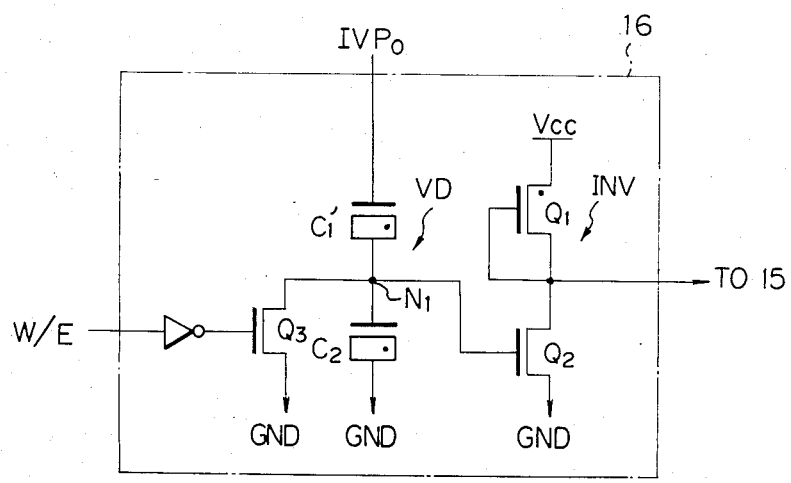
FIG. 5 is a circuit diagram of an embodiment of the voltage detecting device according to the present invention.

In FIG. 5, which illustrates an embodiment of the present invention, a capacitor $C_1'$ is provided instead of the capacitor $C_1$ of FIG. 2, and a switching transistor $Q_3$ is linked between node $N_1$ and the ground GND. This switching transistor $Q_3$ can be controlled by the write/erase signal W/E from the mode selection circuit 14. That is, during a write/erase mode, when the signal W/E is at a high level (="1"), the switching transistor $Q_3$ is turned off. Otherwise, the signal W/E is at a low level (="0"), so that the switching transistor $Q_3$ is turned on. In this case, the capacitor $C_1'$ uses an insulating layer obtained by oxidizing monocrystalline silicon. Therefore, when the write/erase voltage $IVP_0$ is changed from the high level to the low level, the potential at node $N_1$ is swung toward the negative voltage due to the junction leak. However, the potential at node $N_1$ never becomes negative due to the presence of the on-state transistor $Q_3$. Further, in this case, even when the transistor $Q_3$ is in an off state, the potential at node $N_1$ cannot be lower than the negative value of the threshold voltage of the transistor $Q_3$ such as $-0.6$ V.

Also, even when a back bias such as $-5$ V is applied to the substrate, the potential at node $N_1$ is never swung toward the back bias if the write/erase signal W/E is at the "0" state.

Figure 6:
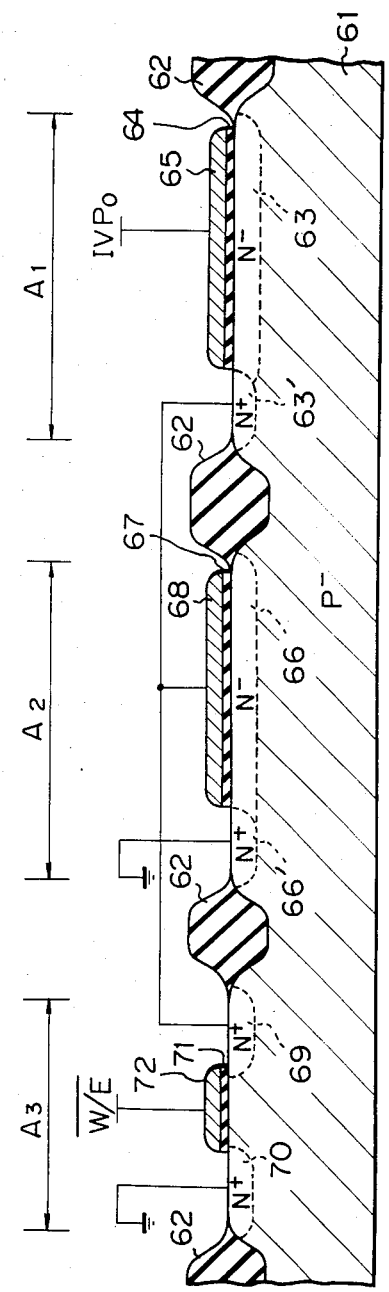
FIG. 6 is a cross-sectional view of the voltage dividing circuit and the switching transistor of FIG. 5.

In FIG. 6, which is a cross-sectional view of the voltage dividing circuit VD and the switching transistor $Q_3$ of FIG. 5, reference numeral 61 designates a monocrystalline silicon substrate; 62 a thick insulating layer (field layer: $SiO_2$); 63 and 66 $N^-$-type impurity diffusion regions; 63', 66', 69, and 70 $N^+$-type impurity diffusion regions; 64, 67, and 71 thin insulating layers ($SiO_2$); and 65, 68, and 72 polycrystalline silicon layers. All the insulating layers are obtained by oxidizing the monocrystalline silicon substrate 61.

In FIG. 6, active areas $A_1$, $A_2$, and $A_3$ are divided by the field layer 62. The capacitor $C_1'$ is formed in the area $A_1$, the capacitor $C_2$ is formed in the area $A_2$, and the switching transistor $Q_3$ is formed in the area $A_3$. That is, in the area $A_1$, the capacitor $C_1'$ is constituted by the diffusion region 63 within the substrate 61, the polycrystalline silicon layer 65 to which the write/erase voltage $IVP_0$ is applied, and the insulating layer 64 therebetween. In the area $A_2$, the capacitor $C_2$ is constituted by the impurity diffusion region 66 within the substrate 61, the polycrystalline silicon layer 68, and the insulating layer 67 therebetween. In this case, note that the polycrystalline silicon layer 66 is connected to the diffusion region 63 via the diffusion region 63', and the diffusion region 68 is grounded by the diffusion region 66'. Further, in the area $A_3$, the switching transistor $Q_3$ is formed by the diffusion regions 69 and 70, and the polycrystalline silicon layer 72 to which the write/erase signal W/E is applied, and the insulating layer 71 directly below the polycrystalline silicon layer 72. In this case, note that the diffusion region 70 is grounded.

In FIG. 6, the voltage dividing ratio of the voltage dividing circuit VD is substantially the same as the area ratio of the polycrystalline silicon layer 65 and the polycrystalline silicon layer 68, which area ratio can be easily determined by lithography technology.

Also, the capacitor $C_1'$ can be constructed by using a polycrystalline silicon-silicon dioxide-polycrystalline silicon configuration. In this case, when the write/erase voltage $IVP_0$ is changed from the high level to the low level, the potential at node $N_1$ is swung toward the positive voltage due to the tunneling effect. However, the potential at node $N_1$ never becomes positive due to the presence of the on-stage transistor $Q_3$.

Further, the capacitor $C_2$ can be constructed by using a polycrystalline silicon-silicon dioxide-polycrystalline silicon configuration, since the voltage applied to the capacitor $C_2$ is small and, accordingly, no tunneling effect is generated in the capacitor $C_2$.

In view of the accuracy of the voltage dividing ratio, it is preferable to use a capacitor $C_2$ of the same configuration as the capacitor $C_1'$, since this ratio is substantially the same as the area ratio of the capacitor $C_1'$ to the capacitor $C_2$.

As explained above, in the voltage dividing device made by the serial connection of the capacitors according to the present invention, since the connection node of the capacitors is grounded by the switching transistor, the decrease or increase in the potential at the node is always corrected. Therefore, when the voltage dividing device according to the present invention is applied to an $E^2PROM$, NOVRAM, and the like, a suitable write/erase voltage can be obtained.

I claim:
1. A voltage detecting device comprising:
    first terminal means to which a detected voltage is to be applied;
    second terminal means;
    a voltage dividing circuit comprising:
        a first capacitor linked between said first terminal means and a common node and
        a second capacitor linked between the common node and said second terminal means;
    switching means linked between the common node and said second terminal means;
    a first means, connected to the common node, for generating an output signal, when the potential at the common node reaches a predetermined value; and
    a second means, connected to said switching means, for turning on said switching means when said detected voltage is not applied to said first terminal means.
2. A device as set forth in claim 1, wherein said first capacitor comprises a monocrystalline silicon layer, a silicon dioxide layer obtained by oxidizing said monocrystalline silicon layer, and a polycrystalline silicon layer formed on said silicon dioxide layer.
3. A device as set forth in claim 1 or 2, wherein said second capacitor comprises a monocrystalline silicon layer, a silicon dioxide layer obtained by oxidizing said monocrystalline silicon layer, and a polycrystalline silicon layer formed on said silicon dioxide layer.
4. A device as set forth in claim 1, wherein said first capacitor comprises two polycrystalline silicon layers having a silicon dioxide layer therebetween, said silicon dioxide layer being obtained by oxidizing one of said polycrystalline silicon layers.
5. A device as set forth in claim 1, wherein said second capacitor comprises two polycrystalline silicon layers having a silicon dioxide layer therebetween, said silicon dioxide layer being obtained by oxidizing one of said polycrystalline silicon layers.
6. A device as set forth in claim 4, wherein said second capacitor comprises two polycrystalline silicon layers having a silicon dioxide layer therebetween, said silicon dioxide layer being obtained by oxidizing one of said polycrystalline silicon layers.
7. A voltage detecting device as set forth in claim 1, wherein said first means comprises an inverter (INV).

* * * * *